(12) United States Patent
Barbour, II

(10) Patent No.: US 8,427,192 B2
(45) Date of Patent: Apr. 23, 2013

(54) SYSTEM, APPARATUSES, METHODS, AND COMPUTER PROGRAM PRODUCTS FOR ELECTRIC MOTOR TESTING AND ANALYSIS

(76) Inventor: David M. Barbour, II, Ona, WV (US)

( * ) Notice: Subject to any disclaimer, the term of this patent is extended or adjusted under 35 U.S.C. 154(b) by 376 days.

(21) Appl. No.: 12/805,309

(22) Filed: Jul. 23, 2010

(65) Prior Publication Data

US 2012/0019281 A1    Jan. 26, 2012

(51) Int. Cl.
*G01R 31/34*    (2006.01)

(52) U.S. Cl.
USPC .................................................. 324/765.01

(58) Field of Classification Search .. 324/762.01–762.1, 324/765.01; 702/58, 64–65; 318/727, 490, 318/802, 823
See application file for complete search history.

(56) References Cited

U.S. PATENT DOCUMENTS

| | | | |
|---|---|---|---|
| 6,128,583 A | 10/2000 | Dowling | |
| 7,127,373 B2 | 10/2006 | House et al. | |
| 7,659,687 B2* | 2/2010 | Wahler et al. | 318/806 |
| 7,769,552 B2* | 8/2010 | Colby et al. | 702/65 |
| 2004/0263342 A1 | 12/2004 | Matlock et al. | |

OTHER PUBLICATIONS

NEMA Standards Publication Condensed MG 1-2002, *Information Guide for General Purpose Industrial AC Small and Medium Squirrel-Cage Induction Motor Standards*, National Electrical Manufacturers Association, 2002.
IEEE Std. 43-2000 (R2006), *IEEE Recommended Practice for Testing Insulation Resistance of Rotating Machinery* (Oct. 12, 2000).
Insulation System Testing, presented by Don Shaw, Product Development Department, PdMA Corporation.
"A Stitch in Time . . . ," *The Complete Guide to Electrical Testing*, Megger (2006).
ASTM D257-07, *Standard Test Methods for DC Resistance or Conductance of Insulating Materials*, ASTM International (May 15, 2007).
CEORDR 1110-2-42, *Motor Windings at Navigational and Lake Facilities*, Department of the Army, U.S. Army Engineer Division, Ohio River Corps of Engineers (Sep. 11, 1992).
*How to Get the Most From Your Electric Motors*, Electrical Apparatus Service Association (2001).
*Insulation Resistance Testing*, Application Note, Fluke Corporation (2007).

* cited by examiner

*Primary Examiner* — Tung X Nguyen

(57) ABSTRACT

Systems, apparatuses, methods, and computer program products (i.e., software) for electric motor testing and analysis. Electric motor winding resistance and motor temperature are measured. The resistance measurement is normalized to a common temperature and electronically displayed in a resistance versus time graph including one or more previously normalized resistance values from previous resistance and temperature measurements. Based on information from the graph, a prediction or estimation can be made as to the remaining acceptable or satisfactory operating time of the electric motor. Such prediction or estimation may be used as an indicator for replacing or refurbishing the electric motor, or as an indicator for performing preventative maintenance on the electric motor.

20 Claims, 12 Drawing Sheets

SYSTEM, APPARATUSES, METHODS, AND COMPUTER PROGRAM PRODUCTS FOR ELECTRIC MOTOR TESTING AND ANALYSIS

FIELD

The disclosed subject matter relates to systems, apparatuses, methods, and computer program products for electric motor testing and analysis.

SUMMARY

Various embodiments of the disclosed subject matter (i.e., one, some, or all) can include a method (e.g., a computerized method) of modifying the frequency of testing an electric motor. The method can comprise receiving as a first input, data representative of insulation resistance of windings of the electric motor; receiving as a second input, data representative of a temperature associated with the windings during a measuring of the insulation resistance of the electric motor windings; automatically and electronically normalizing the data representative of the temperature associated with the windings based on a common temperature, wherein the common temperature is forty degrees Celsius; determining a normalized insulation resistance value of the electric motor windings by applying the normalized temperature data to the data of the first input, which is representative of the insulation resistance of the windings; automatically storing in a nonvolatile storage medium the normalized insulation resistance value of the electric motor windings; electronically plotting and displaying the determined normalized insulation resistance value on a resistance versus time graph, the graph including a previously determined normalized insulation resistance value, wherein the previously determined normalized insulation resistance value has been previously stored in the nonvolatile storage medium; electronically determining a slope of decline of the insulation resistance of the windings over time by comparing the previously determined normalized insulation resistance value with the determined normalized insulation resistance value; and comparing the slope of decline with a first predetermined slope value stored in the nonvolatile storage medium. The method can further comprise decreasing a time interval until the next determination of a normalized insulation resistance value of the electric motor, as compared to a time interval between a time of said previously determined normalized insulation resistance value and a time of said determined normalized insulation resistance value, if the slope of decline exceeds the first predetermined slope value; keeping same the time interval until the next determination of a normalized insulation resistance value of the electric motor, if the slope of decline does not exceed the first predetermined slope value; and electronically outputting a time for the next determination of normalized insulation resistance. Optionally, the method can further comprise projecting time of failure of the electric motor based on the slope of decline.

Optionally, in various embodiments of the disclosed subject matter, the method can further comprise comparing the slope of decline with a second predetermined slope value stored in the nonvolatile storage medium; and refurbishing or replacing the existing motor if the slope of decline exceeds the second predetermined slope value. Various embodiments of the disclosed subject matter can also optionally comprise performing the next determination of a normalized insulation resistance value of the electric motor based on the decreased time, wherein the time interval between a time of said previously determined normalized insulation resistance value and a time of said determined normalized insulation resistance value is one year and the decreased time interval is from six months to one month, in one month increments. Optionally, in various embodiments, the method can comprise receiving as a third input, data representative of a humidity in the vicinity of the electric motor during the measuring of the insulation resistance of the electric motor windings; and automatically and electronically normalizing the data representative of the humidity, wherein said determining the normalized insulation resistance value of the electric motor windings further includes applying the normalized humidity data. Optionally, the method can further comprise performing a Single or Spot Megohm/Megaohm Reading method to measure the insulation resistance of the windings of the electric motor. Optionally, the first and second data are input electronically. Optionally, the first data is input electronically via a first electronic device and the second data is input electronically via a second electronic device. Various embodiments of the disclosed subject matter can optionally comprise making the next determination of a normalized insulation resistance value of the electric motor; automatically storing in the nonvolatile storage medium said next determination of normalized insulation resistance value of the electric motor windings; electronically plotting and displaying said determined next normalized insulation resistance value on the resistance versus time graph; and electronically determining a slope of decline of the insulation resistance of the windings over time based on said determined next normalized insulation resistance value.

Various embodiments of the disclosed subject matter also can include a system for testing an electric motor. The system can comprise: means for measuring a winding resistance of the electric motor; means for measuring a temperature of the windings of the electric motor; means for receiving as a first input data representing the measured winding resistance; means for receiving as a second input data representing the measured temperature of the windings; means for storing the first input data; means for storing the second input data; means for storing a previously measured temperature value, the previously measured temperature value being obtained at a time of taking a previous measurement of the winding resistance of the electric motor; means for automatically correcting the data representative of the temperature of the windings based on the previously measured temperature value; means for determining a corrected winding resistance value of the electric motor windings, the corrected winding resistance value being determined based on the corrected temperature data; means for storing the determined corrected winding resistance value of the electric motor windings; means for electronically displaying on a resistance versus time graph the determined corrected winding resistance value of the electric motor windings; and means for determining when to refurbish or replace the electric motor based on data from the resistance versus time graph. Optionally, in various embodiments, said means for storing the first input data, said means for storing the second input data, said means for storing a previously measured temperature value, and said means for storing the determined corrected winding resistance value can be part of a computer readable and programmable nonvolatile memory device. In various embodiments, optionally, the data from the resistance versus time graph may include one or more previously determined corrected winding resistance values, wherein the previously determined corrected insulation resistance values was previously stored by said means for storing the determined corrected winding resistance value. Optionally, said means for determining when to refurbish or replace the electric motor based on data from the resistance versus time graph can make the determination of when to refurbish or replace the electric motor based on a slope of decline of the most recent two determined corrected winding resistance values over time. Optionally or alternatively, said means for determining when to refurbish or replace the electric motor based on data from the resistance versus time graph can make the determination of when to refurbish or replace the electric motor based on a comparison of the determined corrected winding resistance value with a predetermined winding resistance value, and said means for determining when to refurbish or replace the electric motor can determine that the motor should be refurbished or replaced when the determined corrected winding resistance value is at or below a predetermined winding resistance value. In various embodiments, when the determined corrected winding resistance value is at or below the predetermined winding resistance value, said means for determining when to refurbish or replace the electric motor determines that the electric motor should be refurbished or replaced immediately. Optionally or alternatively, when the determined corrected winding resistance value is at or below a predetermined winding resistance value, said means for determining when to refurbish or replace the electric motor determines that the electric motor has failed. In various embodiments, the system can further comprise means for measuring a humidity associated with the electric motor; means for receiving as a third input data representing the measured humidity; means for storing the third input data; and means for automatically correcting the data representative of the humidity, wherein the corrected winding resistance value cab be determined based on the corrected humidity data. Optionally, said means for determining when to refurbish or replace the electric motor can predict at least one of electric motor failure or a point in time at which the electric motor will not operate satisfactorily. In various embodiments, the system can further comprise means for adjusting the frequency of further winding resistance testing.

Various embodiments of the disclosed subject matter also can include a computer program product comprised of a computer-readable storage medium having stored thereon software instructions that, when executed by a processor, cause the processor to perform operations comprising: receiving data representative of an insulation winding resistance measurement of an electric motor under test; receiving data representative of a temperature measurement of the windings taken at or around the time of the insulation winding resistance measurement; automatically normalizing the temperature to a common temperature; determining a normalized insulation resistance value of the electric motor windings using the normalized temperature; automatically storing the normalized insulation resistance value; plotting and displaying the determined normalized insulation resistance value on a graph, the graph including at least one previously determined normalized insulation resistance value; and estimating, based on one or more data points corresponding to the normalized insulation resistance values plotted on the graph, an amount of operational time of the electric motor until failure or a time of unsatisfactory operation thereof. Alternatively, instead of plotting and graphing the normalized insulation resistance values, in various embodiments, the processor can perform the following operations: comparing the determined normalized insulation resistance value with one or more previously determined normalized insulation resistance values; and estimating, based on a change between the determined normalized insulation resistance value and one or more of the previously determined insulation resistance values, an amount of operational time of the electric motor until failure or unsatisfactory operation thereof. Optionally, the processor can further perform the operations of receiving data representative of a humidity measurement taken in the general area of the electric motor under test, at or around the time of the insulation winding resistance measurement; and automatically normalizing the humidity to a predetermined humidity, wherein said determining a normalized insulation resistance value of the electric motor windings can further use the normalized humidity.

Various embodiments of the disclosed subject matter can further include a hand-held, portable electronic apparatus for periodic electric motor testing and analysis. The apparatus can comprise: a receiving portion to receive inputs associated with an electric motor resistance measurement and a motor temperature measurement; a processor to calculate a normalized temperature value based on the received motor temperature measurement input and to determine a normalized resistance value based on the normalized temperature value and the received electric motor resistance measurement; a memory storage unit to store a plurality of said normalized resistance values determined based on electric motor testing performed at different times; and a display to display electric motor testing and analysis information. In various embodiments, the processor can be operative to produce data for output on the display in graph format, wherein the display may show a plot of the plurality of said normalized resistance values versus time, and wherein, based on the plotted plurality of said normalized resistance values versus time, the processor can automatically determine when to refurbish or replace the electric motor. Optionally, said receiving portion may be a user-interface that provides a means by which a user manually inputs to said receiving portion data for at least one of the electric motor resistance measurement and the motor temperature measurement. In various embodiments, the apparatus can further comprise an electric motor resistance measuring portion to measure a resistance of the electric motor; and a motor temperature measuring portion to measure a temperature of the electric motor. Optionally, a portion of the display may be a touch screen and said receiving portion may receive inputs via the touch screen. In various embodiments, the processor may determine when to refurbish or replace the electric motor based on a slope of decline of the most recent two normalized resistance values. Alternatively, in various embodiments, the processor may determine when to refurbish or replace the electric motor based on a comparison of the most recently determined normalized resistance value with a predetermined resistance value, and the processor may determine that the electric motor should be refurbished or replaced when the most recently determined resistance value is at or below the predetermined resistance value. In various embodiments, optionally, the processor may be further operative to predict at least one of electric motor failure and a point in time at which the electric motor will not operate satisfactorily.

BRIEF DESCRIPTION OF THE DRAWINGS

The accompanying drawings illustrate embodiments of the disclosed subject matter. The disclosed subject matter will be best understood by reading the ensuing specification in conjunction with the drawing figures, in which like elements are designated by like reference numerals, and wherein:

Figure 4:
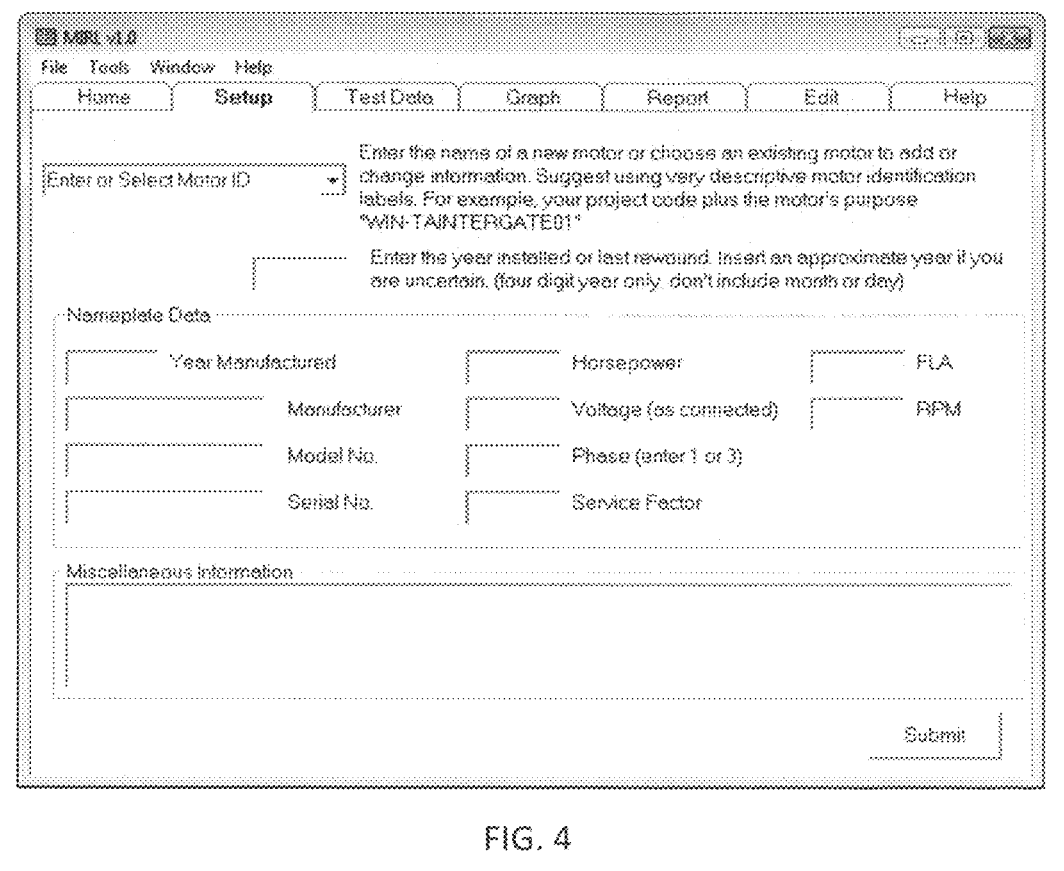

FIG. 4 is a screen shot of a first tab of a user interface according to various embodiments of the disclosed subject matter.

Figure 5:
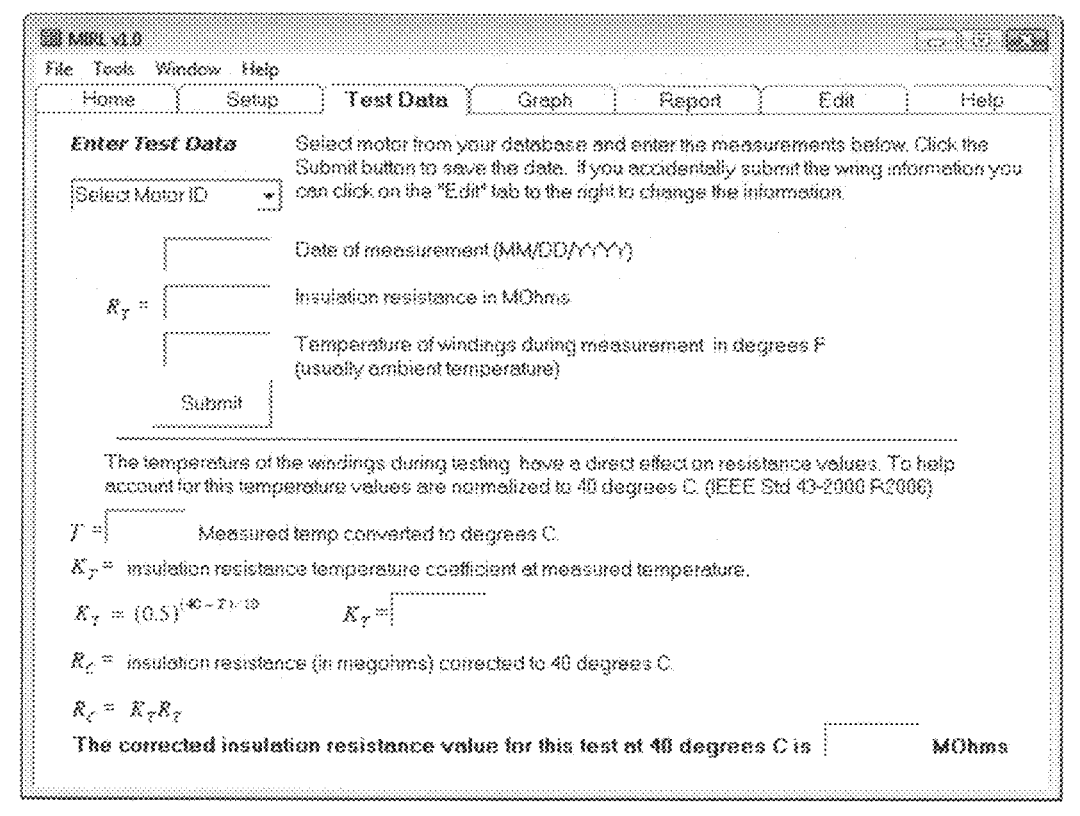

FIG. 5 is a screen shot of a second tab of a user interface according to various embodiments of the disclosed subject matter.

Figure 10A:
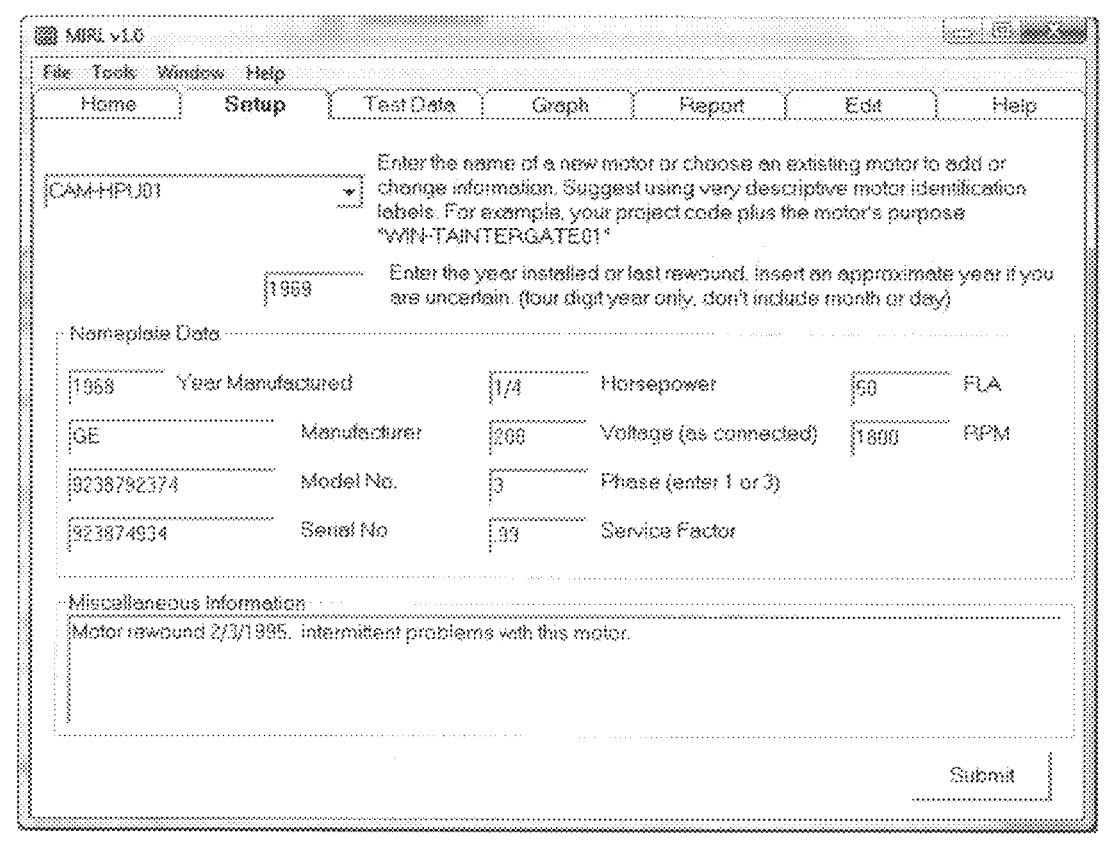
Figure 10B:
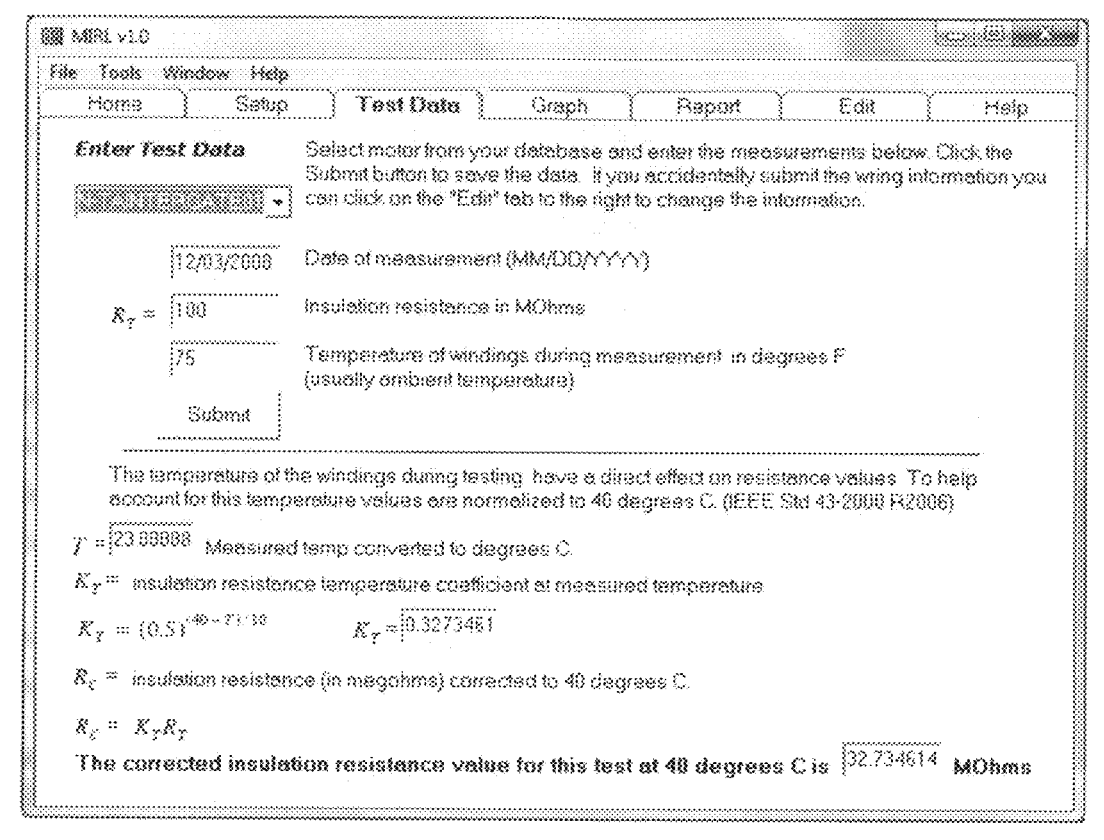

FIG. 10A is a screen shot of the second tab shown in FIG. 5 populated with data according to various embodiments of the disclosed subject matter.

FIG. 10B is a screen shot of the third tab shown in FIG. 6 populated with data according to various embodiments of the disclosed subject matter.

DETAILED DESCRIPTION

Figure 1:
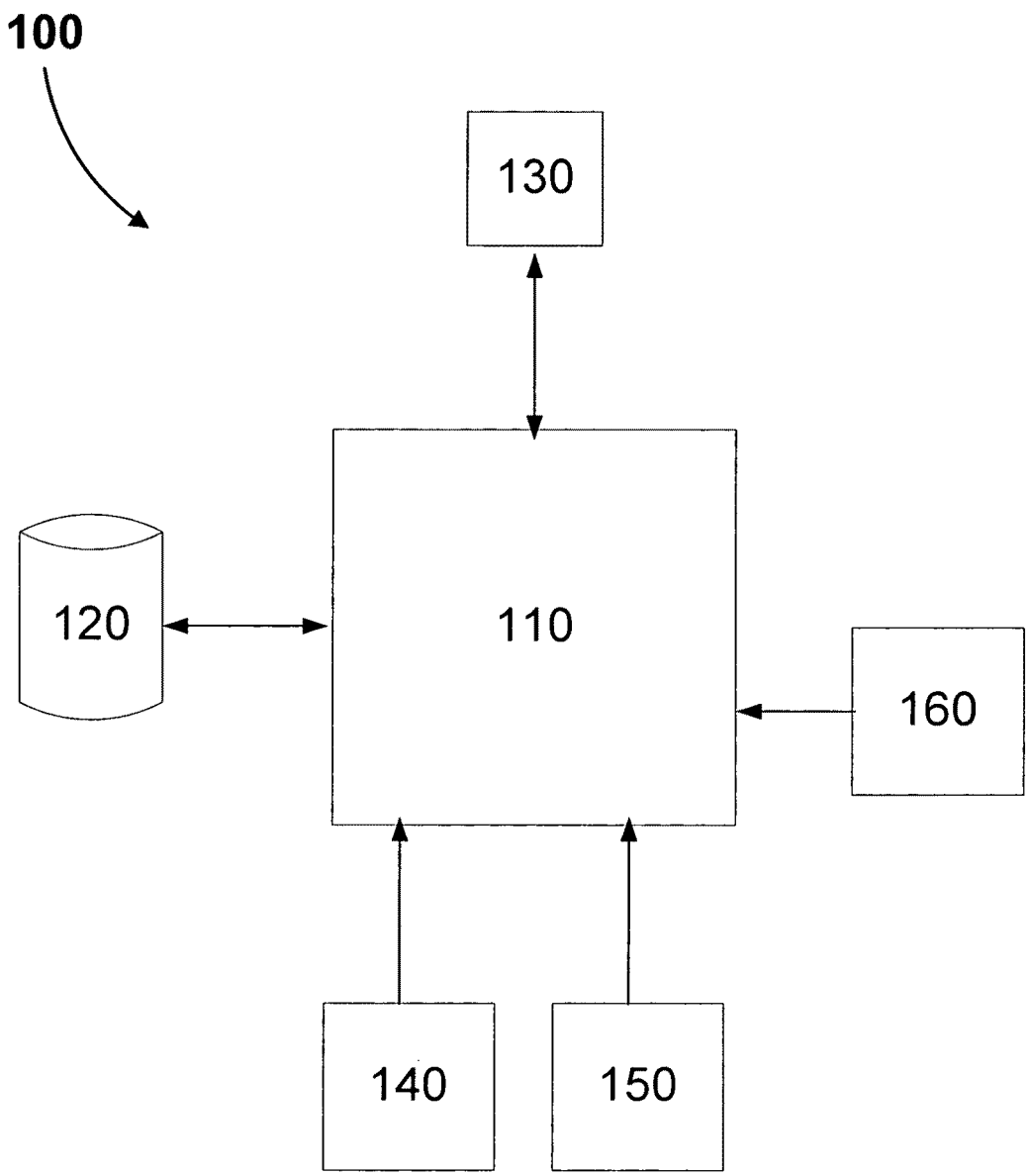
FIG. 1 is a block diagram of a system according to various embodiments of the disclosed subject matter.

In general, various embodiments of the disclosed subject matter include determining and storing normalized electric motor winding resistance values over an extended period of time in order to identify a characteristic or soon-to-be characteristic of the electric motor, such as remaining lifetime of the motor, predicted or estimated time to motor failure or unsatisfactory operation thereof, and/or motor failure. Such information may be used as an indicator for replacing or refurbishing the electric motor, or as an indicator for performing preventative maintenance on the electric motor. Incidentally, the disclosed subject matter can be implemented for any suitable electric motor, such as synchronous machines, induction machines, and dc machines. The normalized electric motor winding resistance values may be taken once per relatively long periods of time, such as every month, every quarter, every season, or every year. Embodiments of the disclosed subject matter do not contemplate determining winding resistance values (including normalized values) at shorter time intervals, such as every second, minute, hour, day, or week. The time period between determining normalized winding resistance values may change based on analysis of determining winding resistance values. Such determination at to changing time period for determining normalized resistance values may be electronically calculated and the results of the calculation displayed. Furthermore, embodiments of the disclosed subject matter store or record the normalized electric motor winding resistance values in correlation to the date in which the values were determined.

Various embodiments of the disclosed subject matter can include measuring electric motor winding resistance and motor temperature. In various embodiments, these two measurements are performed at or about the same time. Based on the resistance measurement or measurements as well as the temperature measurement, a normalized resistance value for the windings is calculated. The calculation can be done automatically upon input of the aforementioned resistance and temperature values. The winding resistance measurement can be normalized to a common temperature and electronically displayed in a resistance (e.g., in MOhms MΩ) versus time (e.g., t in months, quarters, seasons, years, or combination thereof) graph including one or more previously normalized winding resistance values from previous winding resistance and temperature measurements. The determined normalized or corrected winding resistance value also can be stored and/or compared to a predetermined value in order to diagnose a characteristic of the electric motor. The temperature can be normalized to a predetermined temperature, such as a temperature of a previously taken temperature measurement associated with the one or more windings. Insulation resistance varies inversely, on an exponential basis with winding temperature. Thus, for the testing contemplated by the disclosed subject matter, temperature normalization is important to obtain reliable determinations at to normalized motor winding resistance.

In various embodiments, at least the previous winding resistance measurements were previously stored in a memory unit, for example. Based on information for or from the graph, a characteristic or predicted or estimated characteristic of the electric motor, such as remaining lifetime of the motor, predicted or estimated time to motor failure or unsatisfactory operation thereof, and/or motor failure, can be identified. As alluded to above, a frequency of further electric motor testing and analysis may be modified or kept the same based information from or for the graph. For example, the frequency may be increased (i.e., the time until the next test may be decreased as compared to the time between the two previous tests). Optionally, in various embodiments, normalized humidity data associated with the motor may be used to determine the normalized winding resistance values.

Turning now to the figures, FIG. 1 is a block diagram of a system 100 according to various embodiments of the disclosed subject matter.

System 100 can be comprised of a processing element 110, a storage element 120, a display element 130, a resistance measuring element 140, and a temperature measuring element 150. Not explicitly shown in FIG. 1, processing element 110 also may include on-board storage or memory, such as memory for processing and storing computer programs for execution. Optionally, system 100 may include a humidity or moisture measuring element 160. An electric motor under test (i.e., for taking a resistance measurement and other measurements), is not shown in FIG. 1. In various embodiments, the motor under test will be disconnected from its normal power supply and discharged.

Generally, system 100 can operate to take, read, or receive a resistance measurement of one or more electric motor windings (either stator or rotor windings), such as insulation winding resistance. In various embodiments, resistance measuring element 140 can be used to take, measure, or receive the resistance of the electric motor windings. Resistance measuring element 140 can be any suitable resistance measuring system, apparatus, or device. For example, in various embodiments, resistance measuring element 140 is a single or spot megohm/megaohm reading or measurement system, apparatus, or device, such as a megaohm meter. Though FIG. 1 shows an arrow connecting resistance measuring element 140 with processing element 110, these two elements are not necessarily physically connected (e.g., by electrical wiring). For example, in various embodiments, resistance measuring element 140 can be a separate resistance measuring element from the processing element and data or information from the resistance measuring element 140 can be entered manually by a user of the processing element, for example. Alternatively or optionally, data or information from the resistance measuring element 140 can be transmitted wirelessly from the resistance measuring element 140 to the processing element 110.

System 100 also can operate to take, read, or receive a temperature measurement associated with electric motor. The temperature measurement can be taken at any suitable location and by any suitable means. For example, if the electric motor has been at rest for a predetermined period of time, it may be assumed that the windings at are at ambient temperature of the interior or exterior of the windings or motor. Thus, in various embodiments, the temperature measurement is an ambient temperature measurement of the electric motor and may be representative of the temperature of one or more of the electric motor windings. In various embodiments, temperature measuring element 150 is operative to take, read, or receive a temperature measurement. Temperature measuring element 150 can be any suitable element for taking a temperature, ambient or otherwise, of an electric motor under test, such as a thermometer, an infrared thermometer, etc. Though FIG. 1 shows an arrow connecting temperature measuring element 150 with processing element 110, these two elements are not necessarily physically connected (e.g., by an electrical wiring). For example, in various embodiments, temperature measuring element 150 can be a separate temperature measuring element from the processing element and data or information from the temperature measuring element 150 can be entered manually by a user of the processing element, for example. Alternatively or optionally, data or information from the temperature measuring element 150 can be transmitted wirelessly from the temperature measuring element 150 to the processing element 110.

Optionally, in various embodiments, system 100 also can operate to take, read, or receive a humidity or moisture measurement associated with electric motor. Humidity measuring element 160 can take, read, or receive a humidity measurement. One example of a humidity measuring element 160 would be where the electric motor under test is in an air conditioned room and a user or technician enters zero or a very low humidity value into a user interface. The humidity measuring element 160 according to various embodiments of the disclosed subject matter is not limited to this example, however, and the humidity may be normalized based on an algorithm executed by processing element 110. Though FIG. 1 shows an arrow connecting humidity measuring element 160 with processing element 110, these two elements are not necessarily physically connected (e.g., by an electrical wiring). For example, in various embodiments, humidity measuring element 160 can be a separate temperature measuring element from the processing element and data or information from the humidity measuring element 160 can be entered manually by a user of the processing element, for example. Alternatively or optionally, data or information from the humidity measuring element 160 can be transmitted wirelessly from the humidity measuring element 160 to the processing element 110.

Though elements 140, 150, and 160 are shown in FIG. 1 as being three separate elements, in various embodiments, one input interface can be provided to receive data representative of resistance and temperature, and optionally humidity. For example, the input interface can be a user interface, such as a graphical user interface or touch screen capable of receiving user input. So the aforementioned elements in this case would be three different input fields of the interface. Measurements using other respective devices thus have been used to obtain these readings and a technician or user inputs the data from the readings into the respective fields in the user interface. Furthermore, as will be discussed with reference to apparatus 200 in FIG. 2, the functionality of at least elements 140 and 150, and, optionally element 160, can be part of one apparatus or device 200.

Though FIG. 1 shows only measuring or "input" elements 140, 150, and 160, processor 110 can receive other inputs. In various embodiments, data inputs shown in the exemplary user interface of FIGS. 4 through 10 may be further inputted. For example, the following information may be added: name plate data, year installed or last rehabbed, miscellaneous notes on each motor; data of measurement, measured insulation resistance value, measured temperature, etc. In various embodiments, some of the data may be manually entered, such as year of motor installation and date of measurement, and some data may be received electronically, such as measured insulation resistance value, measured temperature, and/or measured humidity. Any suitable combination of inputs may be provided. Thus, in various embodiments, resistance value readings may be manually entered via a user interface, whereas in other embodiments resistance value readings can be electronically received and input. The inputs are not limited to those shown in the exemplary user interface of FIGS. 4 through 10, and any suitable inputs or data may be input for motor testing and analysis.

Processing element 110 can be, for example, a computer, such as laptop or a desktop, a hand-held device, such as a personal digital assistant ("PDA") or cell phone, a microprocessor, a microcontroller, a computerized processor, etc. Processing element 110 can receive inputs, such as those discussed above. For example, processing element 110 may receive data representing a temperature measurement of the electric motor and automatically correct or normalize the data to a common temperature, such as forty degrees Celsius or a previously other normalized temperature value based on a previously measured and recorded temperature (e.g., the temperature of the motor the last time it was tested). Processing element 110 also may receive data representing a winding resistance measurement and determine a normalized winding resistance value based on the normalized temperature value and the received winding resistance measurement data, so that so that winding resistance value trending over time can be tracked and analyzed at a constant relative temperature. Optionally, in various embodiments, processing element 110 also may receive data representing a humidity or moisture associated with the electric motor, such as a humidity or moisture content in the vicinity or general local area or space of the electric motor. Optionally, in various embodiments, the processing element 110 may correct or normalize the received humidity or moisture data to a common humidity or moisture value. Thus, optionally, the normalized humidity or moisture data may be used to determine the corrected or normalized winding resistance value.

Processing element 110 can cause some or all of the normalized data to be stored, either in on-board or off board memory. Storage of such data may be used for comparison with future testing results. For example, processing element 110 may send to storage element 120 normalized wiring resistance data values. In various embodiments, the storage normalized winding resistance values are from sequential individual tests of the winding resistance of the electric motor over an extended period of time. Processing element 110 also may send to display element 130 normalized wiring resistance data for output thereon. In various embodiments, the normalized wiring resistance data may be plotted on a graph of normalized wiring resistance versus time. In various embodiments, the most recently determined normalized wiring resistance value may be plotted with previously determined normalized wiring resistance values retrieved from storage element 120. In various embodiments, the processing element 110 can automatically determine when to refurbish or replace the electric motor based data for or from the plot of normalized resistance values versus time. Alternatively or optionally, the processing element 110 can predict at least one of electric motor failure and a point in time at which the electric motor will not operate satisfactorily. Optionally, in various embodiments, processing element 110 can determine a slope of the most recently determined winding resistance value and at least the second most recently determined winding resistance value. Based on the determined slope, the processing element 110 may determine that the motor has failed, will soon fail (including estimating a date of predicted failure), or is operating unsatisfactorily. Thus, processor 110 may cause an indication, by way of display element 130, that the electric motor has failed, will fail, is operating unsatisfactorily, an estimated date of motor failure, or that the electric motor needs to be refurbished or replaced. Optionally or alternatively, in various embodiments, processing element 110 can make a comparison of the determined corrected winding resistance value with a predetermined winding resistance value. For example, if the determined corrected winding resistance value is at or below the predetermined winding resistance value, processor 110 may determine that the motor has failed, will soon fail (including estimating a date of predicted failure), or is operating unsatisfactorily. Thus, processor 110 may cause an indication, by way of display element 130, that the electric motor has failed, will fail, is operating unsatisfactorily, an estimated date of motor failure, or that the electric motor needs to be refurbished or replaced. In various embodiments, processing element 110 may calculate and output on display element 130 a "new" time interval for retesting (i.e., for the next test) the winding resistance of the electric motor. For example, the processing element may decrease the time for a next winding resistance measurement based on the determined slope and/or whether the most recently determined corrected winding resistance value is at or below the predetermined winding resistance value.

Storage element 120 can be any suitable storage element, such as a database in the form of a non-volatile memory device, such as EEPROM or RAM. Though FIG. 1 shows storage element 120 being outside processing element 110, in various embodiments it can be located internal to processing element 110. Furthermore, though shown as a single unit in FIG. 1, storage element 120 may be a plurality of individual storage units, such as different locations in one storage unit or multiple individual storage devices, wherein each unit or device stores information for one particular electric motor or one characteristic of each of the electric motors. Thus, storage element 120 can storage a variety of information and data for a particular motor, as well as a variety of information for a number of particular motors. For example, data shown in the user interface of FIGS. 4 through 10 may be stored in storage element 120, such as normalized winding resistance data. Data stored in storage element 120 for any electric motor having been previously tested and data recorded with system 100 may be retrieved so that this information can be displayed by display element 130 and/or used by processing element 110 for further calculations based on "new" measurements.

Display element 130 can be any suitable electronic display, such as a computer monitor, a touchscreen, LED, or LCD display on a hand-held device, etc. Display element 130 can display electric motor testing and analysis information, such as the information shown in the user interface of FIGS. 4 through 10. In various embodiments, display element 130 can have a graphing capability or functionality, whereby it can output a resistance versus time curve based on historical and current normalized electric motor winding resistance readings. Processing element 110 can interpret resistance and time data for or of the graphical display to determine a condition of the motor windings. Data also may be entered by display element 130, for example, if the display element has touchscreen capabilities. Furthermore, not explicitly shown in FIG. 1, a "manual" user interface may be provided to enter data, such as a computer keyboard, a mouse, a keypad, etc.

Figure 2:
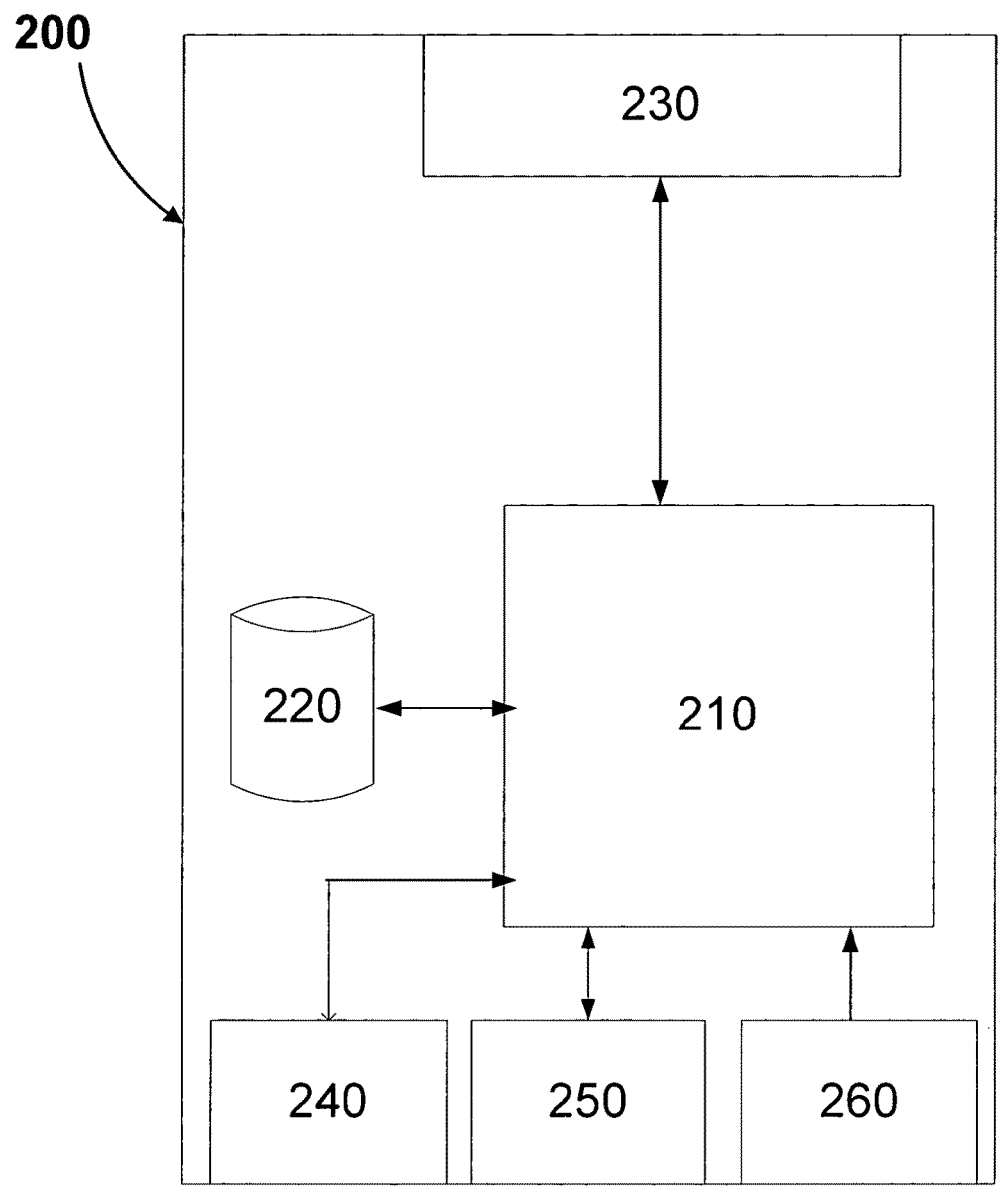
FIG. 2 is a block diagram of an apparatus according to various embodiments of the disclosed subject matter.

FIG. 2 shows an apparatus 200 according to various embodiments of the disclosed subject matter. Apparatus 200 is similar to system 100 in functionality. That is to say, in various embodiments, apparatus 200 may be able to perform all of the functions of the individual elements 110, 120, 130, 140, 150, and 160 of system 100. For example, apparatus 200 may be a hand-held, portable electronic apparatus a technician can use for periodic electric motor testing and analysis. Motor resistance portion 240 can either measure motor resistance (essentially a built-in spot or single Megohm/Megaohm device) or receive data representative of a measured motor winding resistance value, such as by way of a wireless or wired signal from a spot or single Megohm/Megaohm device or by way of a user manual input via a user interface. Similarly, motor temperature portion 250 and humidity portion 260 can either measure motor temperature and humidity, respectively, or receive data representative of a measured motor temperature and humidity. Item 210 is a processor, item 220 is a storage element, and item 230 is a display element. These items are substantially the same as described above for system 100 and will not be described again. Not explicitly shown, apparatus 200 also may have a user interface, such as a touchscreen or keypad, or combination thereof.

Figure 3:
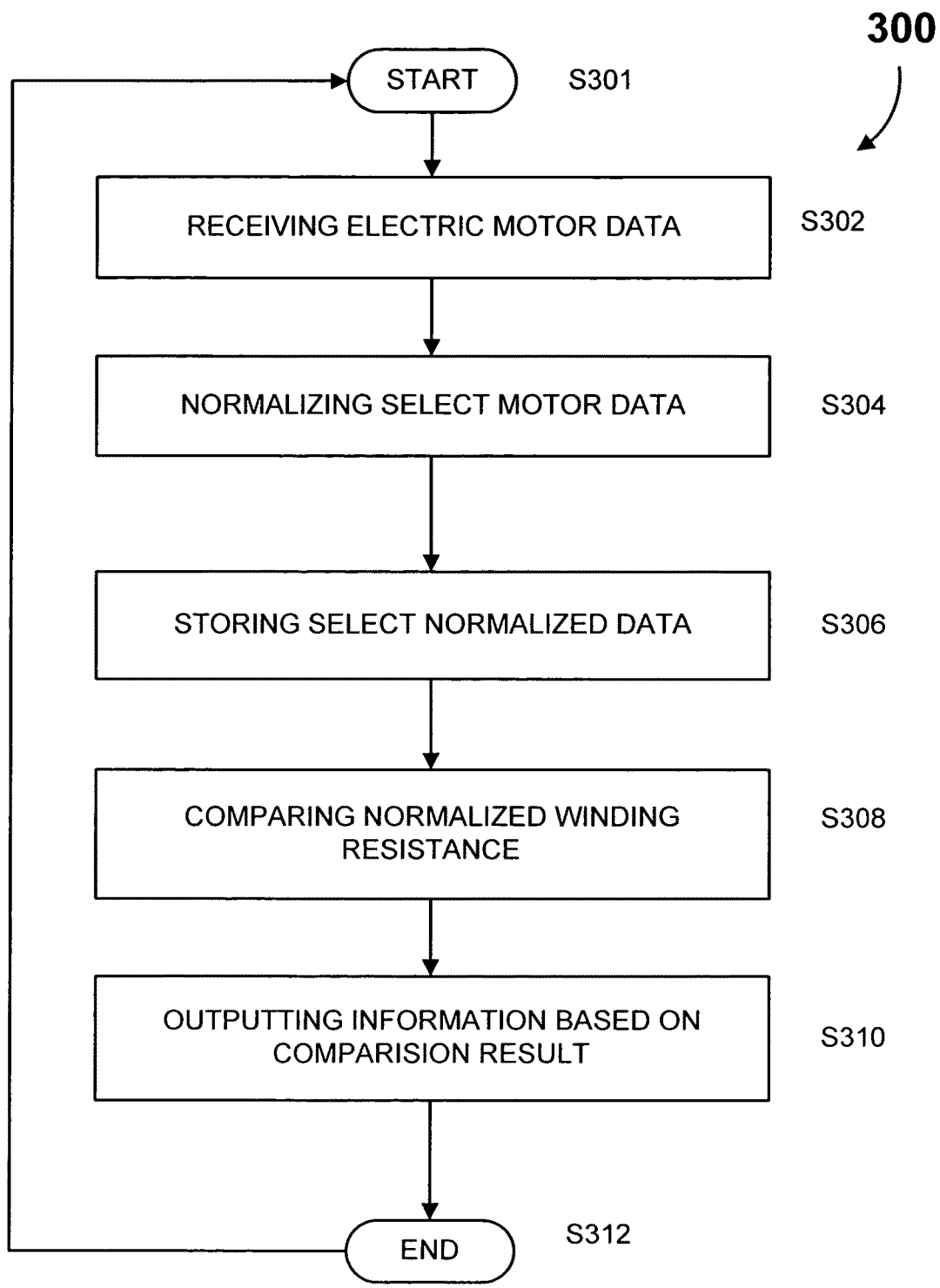
FIG. 3 shows a flow chart of a method according to various embodiments of the disclosed subject matter.
Figure 6:
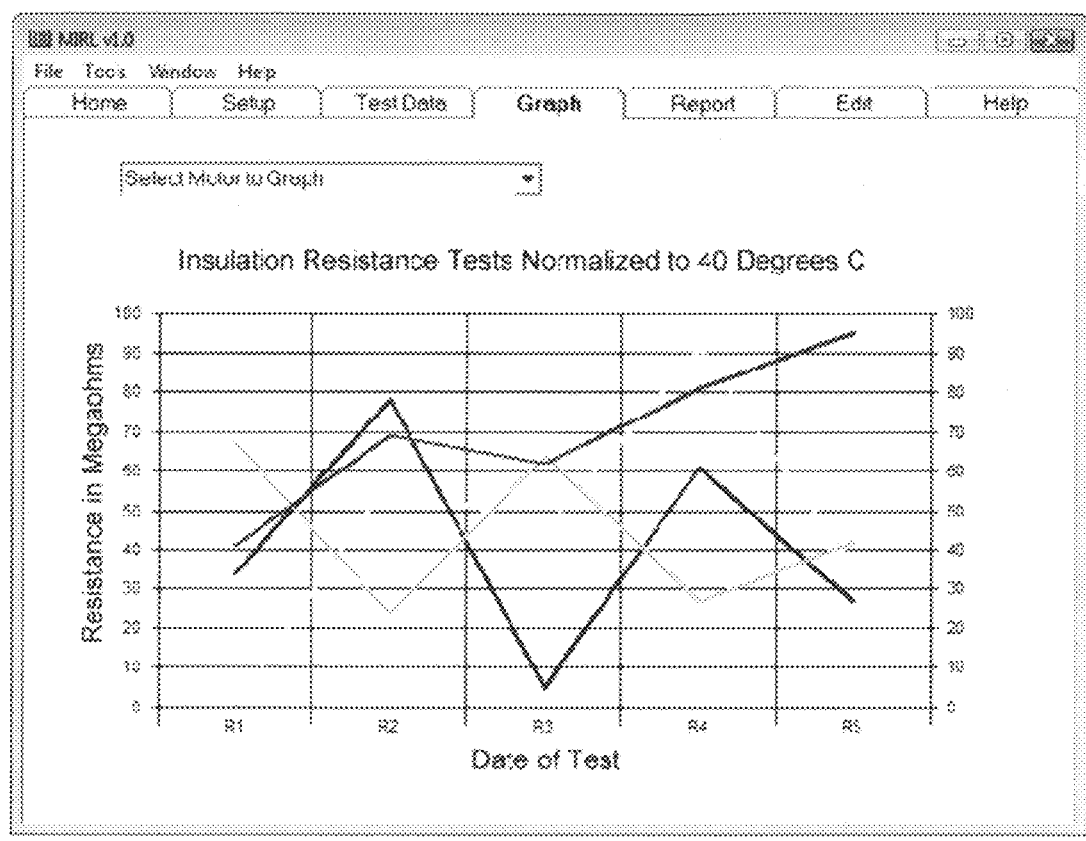
FIG. 6 is a screen shot of a third tab of a user interface according to various embodiments of the disclosed subject matter.
Figure 7:
FIG. 7 is a screen shot of a fourth tab of a user interface according to various embodiments of the disclosed subject matter.
Figure 8:
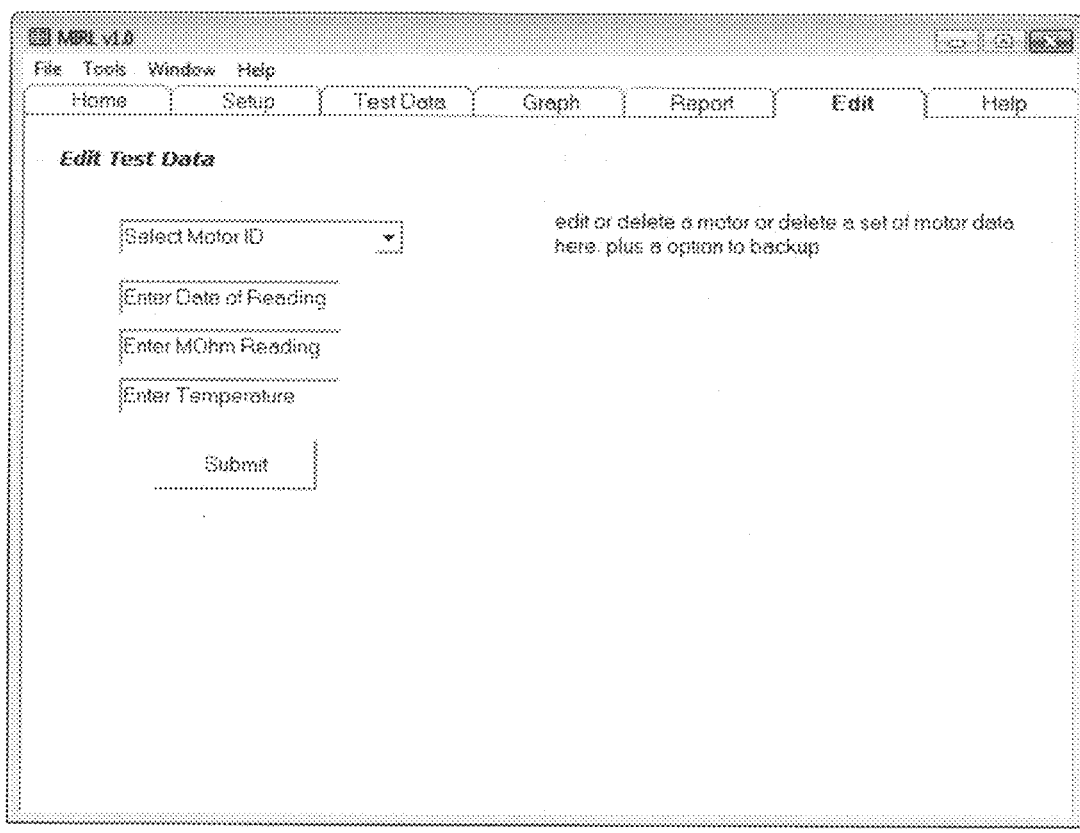
FIG. 8 is a screen shot of a fifth tab of a user interface according to various embodiments of the disclosed subject matter.
Figure 9:
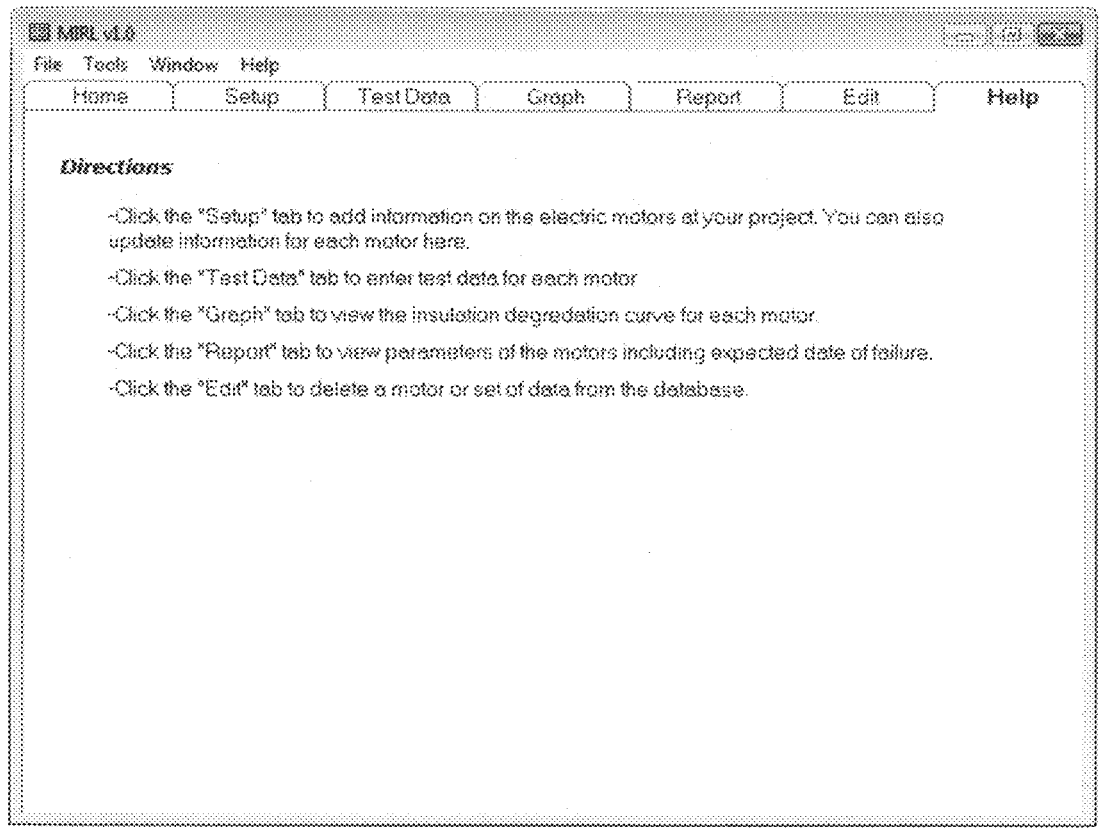
FIG. 9 is a screen shot of a sixth tab of a user interface according to various embodiments of the disclosed subject matter.
Figure 10C:
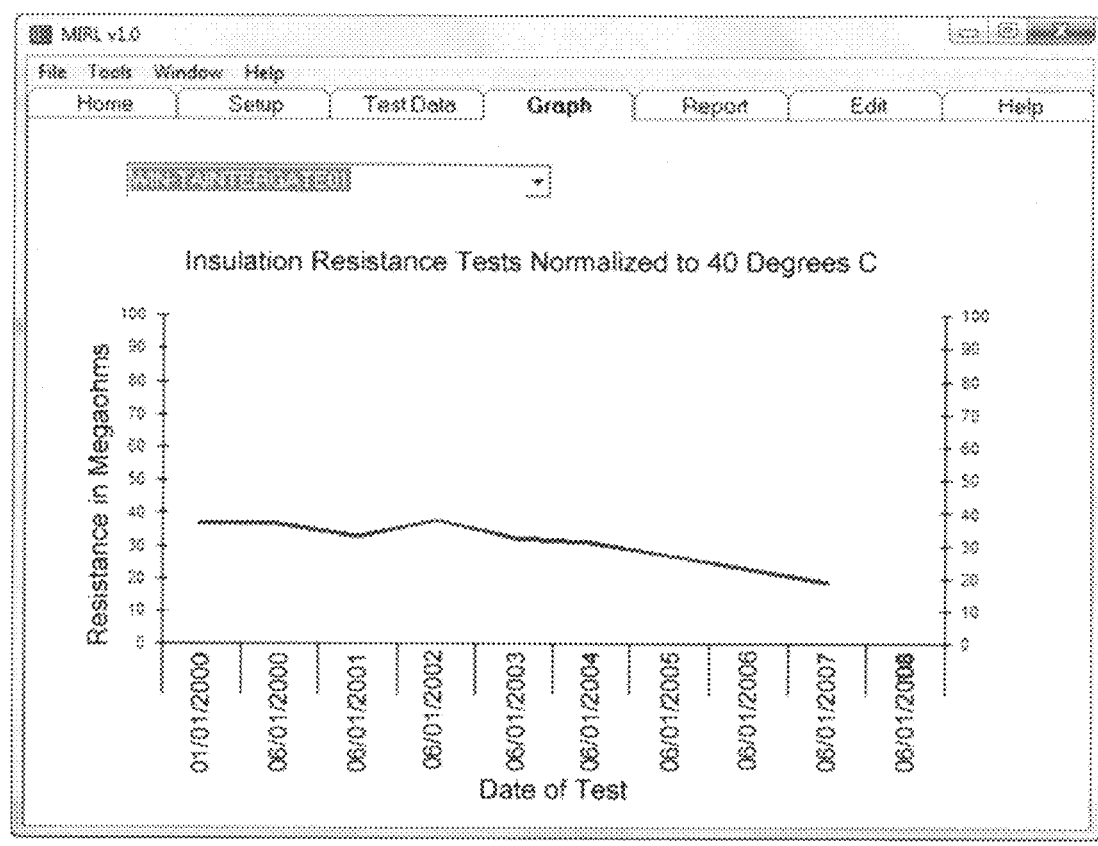
FIG. 10C is a screen shot of the fourth tab shown in FIG. 7 showing a resistance versus time "curve" plotted on a chart and based on the data shown in the tabs of FIGS. 10A and 10B, according to various embodiments of the disclosed subject matter.

FIG. 3 is a flow chart of a method 300 according to various embodiments of the disclosed subject matter. The method 300 and variations thereof may be readily implemented in a computer program product comprised of a computer-readable storage medium having stored thereon software instructions that, when executed by a processor, cause the processor to perform operations as described herein and as appreciated to those skilled in the computer arts.

Method 300 can start at S301 and proceed to S302.

At S302, electric motor data can be received for a motor under test or to be tested. In various embodiments, received data can include data representative of insulation resistance of windings of the electric motor and data representative of a temperature associated with the windings. In various embodiments, the temperature is taken at or around a time as that of a measurement of insulation resistance of windings of the motor. Optionally, received data can include data representative of a humidity associated with the electric motor at the time of taking the measurement of insulation resistance of windings of the motor. Received data also can include a time (e.g., the date) of taking the measurement of insulation resistance of windings of the motor. Received data also can include data shown in the user interface of FIGS. 4 through 10.

S304 can include normalizing the temperature data to a common temperature and normalizing or correcting the data representative of the measured insulation resistance value based on the normalized temperature. Optionally, if a humidity data is received, this data also may be normalized to a common humidity. In various embodiments, the normalization can be done automatically and electronically.

At S306, select normalized data can be stored in a storage medium. Unless this is the first time a motor has been tested, the storage medium should have stored therein previous select normalized data. Select normalized data to be stored in a storage medium can include the determined normalized insulation resistance value(s). Optionally, normalized temperature values can also be stored. In various embodiments, data may have been previously or later stored, such as the information shown in the exemplary user interface shown in FIGS. 4 through 10. In various embodiments, the storing can be done automatically.

S308 can include comparing the determined normalized winding resistance. In various embodiments, the determining normalized winding resistance can be compared with one or more previously determining normalized winding resistance values.

For example, the normalized winding resistance values (current and previous) can be plotted and displayed in a resistance versus time graph. A comparison between the current normalized winding resistance value and one or more previous values can be made to determine a slope (e.g., declining slope) for the normalized winding resistance values. In various embodiments, the slope determination can be done electronically based on data for the graph or of the graph. The determined slope can be compared with one or more predetermined values. For example, if the slope of decline exceeds a predetermined slope value, the time period for a next resistance test may be shortened, whereas if the slope of decline does not exceed the predetermined slope value, the time period for the next resistance test may be kept the same as a previous time period. Optionally, if the slope of decline exceeds another predetermined value, it can indicate that the motor has failed, or needs refurbishing or replacing. Optionally or alternatively, the presently determining winding resistance value may be compared to a predetermined value.

Based on the comparison result, a characteristic or predicted or estimated characteristic of the electric motor, such as remaining lifetime of the motor, predicted or estimated time to motor failure or unsatisfactory operation thereof, and/or motor failure, can be identified or determined. For example, based on the data of or for the graph, an amount of operational time of the electric motor until failure or unsatisfactory operation thereof may be estimated.

At S310 information is outputted based on the results of the comparison. For example, an electronic display may display a time for the next determination of normalized insulation resistance, such as remaining lifetime of the motor, predicted or estimated time to motor failure or unsatisfactory operation thereof, and/or motor failure.

At S312, the method can end, or, if further long-term, periodic testing is to occur, the method 300 may return to S301 and repeat the process. As indicated earlier, generally the process will not repeat until one month, a quarter, six months, or one year after the most recent pass through the flow chart.

FIGS. 4 through 10 an exemplary user interface with various data fields. The data fields may be populated by any suitable means, such as automatically and electronically by a processing element, by a user's manual input, or a combination thereof. FIGS. 10A through 10C shown an example of output results based on data input to the system. The data fields are in now way limited to those shown in this example user interface.

Having now described embodiments of the disclosed subject matter, it should be apparent to those skilled in the art that the foregoing is merely illustrative and not limiting, having been presented by way of example only. Numerous modifications and other embodiments (e.g., combinations, rearrangements, etc.) are within the scope of one of ordinary skill in the art and are contemplated as falling within the scope of the disclosed subject matter and any equivalent thereto. It can be appreciated that variations to the present disclosed subject matter would be readily apparent to those skilled in the art, and the present disclosed subject matter is intended to include those alternatives. Further, since numerous modifications will readily occur to those skilled in the art, it is not desired to limit the disclosed subject matter to the exact construction and operation illustrated and described, and accordingly, all suitable modifications and equivalents may be resorted to, falling within the scope of the disclosed subject matter.

It should be appreciated that any steps described above may be repeated in whole or in part in order to perform a contemplated electric motor testing and/or analysis task. Further, it should be appreciated that the steps mentioned above may be performed on a single or distributed processor. Also, the processes, elements, components, modules, and units described in the various figures of the embodiments above may be distributed across multiple computers or systems or may be co-located in a single processor or system.

Embodiments of the method, system, apparatus, and computer program product (i.e., software) for electric motor testing and analysis, may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic device such as a PLD, PLA, FPGA, PAL, or the like. In general, any process capable of implementing the functions or steps described herein can be used to implement embodiments of the method, system, or computer program product for providing or presenting data.

Furthermore, embodiments of the disclosed method, system, apparatus, and computer program product for electric motor testing and analysis may be readily implemented, fully or partially, in software using, for example, object or object-oriented software development environments that provide portable source code that can be used on a variety of computer platforms. Alternatively, embodiments of the disclosed method, system, and computer program product for electric motor testing and analysis can be implemented partially or fully in hardware using, for example, standard logic circuits or a VLSI design. Other hardware or software can be used to implement embodiments depending on the speed and/or efficiency requirements of the systems, the particular function, and/or a particular software or hardware system, microprocessor, or microcomputer system being utilized. Embodiments of the method, system, apparatus, and computer program product for electric motor testing and analysis can be implemented in hardware and/or software using any known or later developed systems or structures, devices and/or software by those of ordinary skill in the applicable art from the functional description provided herein and with a general basic knowledge of the computer arts.

Incidentally, the following documents are hereby incorporated by reference in their entireties: U.S. Pat. No. 7,127,373; IEEE Standard 43-2000 (R2006), IEEE Recommended Practice for Testing Insulation Resistance of Rotating Machinery; ASTM D257-2009, Standard Test Methods for DC Resistance for Conductance of Insulating Materials; EASA, 2001, How to Get the Most From Your Electric Motors; FLUKE, 2007, Insulation Resistance Testing Application Note; MEGGER, 2006, A Stitch in Time; CEORDR 110-2-42, 1992

Motor Windings at Navigations and Lake Facilities; and Insulation System Testing, Presented by Don Shaw, Company PdMA Corporation, Product Development Department.

The invention claimed is:

1. A computerized method of modifying the frequency of testing an electric motor, comprising:
receiving as a first input, data representative of insulation resistance of windings of the electric motor;
receiving as a second input, data representative of a temperature associated with the windings during a measuring of the insulation resistance of the electric motor windings;
automatically and electronically normalizing the data representative of the temperature associated with the windings based on a common temperature, the common temperature being forty degrees Celsius;
determining a normalized insulation resistance value of the electric motor windings by applying the normalized temperature data to the data of the first input, which is representative of the insulation resistance of the windings;
automatically storing in a nonvolatile storage medium the normalized insulation resistance value of the electric motor windings;
electronically plotting and displaying the determined normalized insulation resistance value on a resistance versus time graph, the graph including a previously determined normalized insulation resistance value, the previously determined normalized insulation resistance value having been previously stored in the nonvolatile storage medium;
electronically determining a slope of decline of the insulation resistance of the windings over time by comparing the previously determined normalized insulation resistance value with the determined normalized insulation resistance value;
comparing the slope of decline with a first predetermined slope value stored in the nonvolatile storage medium;
if the slope of decline exceeds the first predetermined slope value, decreasing a time interval until the next determination of a normalized insulation resistance value of the electric motor, as compared to a time interval between a time of said previously determined normalized insulation resistance value and a time of said determined normalized insulation resistance value;
if the slope of decline does not exceed the first predetermined slope value, keeping same the time interval until the next determination of a normalized insulation resistance value of the electric motor; and
electronically outputting a time for the next determination of normalized insulation resistance.

2. The method of claim 1, further comprising projecting time of failure of the electric motor based on the slope of decline.

3. The method of claim 1, further comprising:
comparing the slope of decline with a second predetermined slope value stored in the nonvolatile storage medium; and
refurbishing or replacing the existing motor if the slope of decline exceeds the second predetermined slope value.

4. The method of claim 1, further comprising performing the next determination of a normalized insulation resistance value of the electric motor based on said decreased time interval, wherein the time interval between a time of said previously determined normalized insulation resistance value and a time of said determined normalized insulation resistance value is one year and the decreased time interval is from six months to one month, in one month increments.

5. The method of claim 1, further comprising:
receiving as a third input, data representative of a humidity in the vicinity of the electric motor during the measuring of the insulation resistance of the electric motor windings; and
automatically and electronically normalizing the data representative of the humidity,
wherein said determining the normalized insulation resistance value of the electric motor windings further includes applying the normalized humidity data.

6. The method of claim 1, further comprising performing a Single or Spot Megohm/Megaohm Reading method to measure the insulation resistance of the windings of the electric motor.

7. The method of claim 1, wherein the first and second data are input electronically.

8. The method of claim 1, wherein the first data is input electronically via a first electronic device and the second data is input electronically via a second electronic device.

9. The method of claim 1, further comprising:
making the next determination of a normalized insulation resistance value of the electric motor;
automatically storing in the nonvolatile storage medium said next determination of normalized insulation resistance value of the electric motor windings;
electronically plotting and displaying said determined next normalized insulation resistance value on the resistance versus time graph; and
electronically determining a slope of decline of the insulation resistance of the windings over time based on said determined next normalized insulation resistance value.

10. A system for testing an electric motor, the system comprising:
means for measuring a winding resistance of the electric motor;
means for measuring a temperature of the windings of the electric motor;
means for receiving as a first input data representing the measured winding resistance;
means for receiving as a second input data representing the measured temperature of the windings;
means for storing the first input data;
means for storing the second input data;
means for storing a previously measured temperature value, the previously measured temperature value being obtained at a time of taking a previous measurement of the winding resistance of the electric motor;
means for automatically correcting the data representative of the temperature of the windings based on the previously measured temperature value;
means for determining a corrected winding resistance value of the electric motor windings, the corrected winding resistance value being determined based on the corrected temperature data;
means for storing the determined corrected winding resistance value of the electric motor windings;
means for electronically displaying on a resistance versus time graph the determined corrected winding resistance value of the electric motor windings; and
means for determining when to refurbish or replace the electric motor based on data from the resistance versus time graph.

11. The system of claim 10, wherein said means for storing the first input data, said means for storing the second input data, said means for storing a previously measured temperature value, and said means for storing the determined corrected winding resistance value are part of a computer readable and programmable non-volatile memory device.

12. The system of claim 10, wherein the data from the resistance versus time graph includes one or more previously determined corrected winding resistance values, the previously determined corrected insulation resistance values having been previously stored by said means for storing the determined corrected winding resistance value.

13. The system of claim 10, wherein said means for determining when to refurbish or replace the electric motor based on data from the resistance versus time graph makes the determination of when to refurbish or replace the electric motor based on a slope of decline of the most recent two determined corrected winding resistance values over time.

14. The system of claim 10,
wherein said means for determining when to refurbish or replace the electric motor based on data from the resistance versus time graph makes the determination of when to refurbish or replace the electric motor based on a comparison of the determined corrected winding resistance value with a predetermined winding resistance value, and
wherein said means for determining when to refurbish or replace the electric motor determines that the motor should be refurbished or replaced when the determined corrected winding resistance value is at or below a predetermined winding resistance value.

15. The system of claim 14, wherein, when the determined corrected winding resistance value is at or below the predetermined winding resistance value, said means for determining when to refurbish or replace the electric motor determines that the electric motor should be refurbished or replaced immediately.

16. The system of claim 14, wherein, when the determined corrected winding resistance value is at or below a predetermined winding resistance value, said means for determining when to refurbish or replace the electric motor determines that the electric motor has failed.

17. The system of claim 10, further comprising:
means for measuring a humidity associated with the electric motor;
means for receiving as a third input data representing the measured humidity;
means for storing the third input data; and
means for automatically correcting the data representative of the humidity,
wherein the corrected winding resistance value is determined based on the corrected humidity data.

18. The system of claim 10, wherein said means for determining when to refurbish or replace the electric motor predicts at least one of electric motor failure and a point in time at which the electric motor will not operate satisfactorily.

19. A computer program product comprised of a non-transitory computer-readable storage medium having stored thereon software instructions that, when executed by a processor, cause the processor to perform operations comprising:
receiving data representative of an insulation winding resistance measurement of an electric motor under test;
receiving data representative of a temperature measurement of the windings taken at or around the time of the insulation winding resistance measurement;
automatically normalizing the temperature to a common temperature;
determining a normalized insulation resistance value of the electric motor windings using the normalized temperature;
automatically storing the normalized insulation resistance value;
plotting and displaying the determined normalized insulation resistance value on a graph, the graph including at least one previously determined normalized insulation resistance value; and
estimating, based on one or more data points corresponding to the normalized insulation resistance values plotted on the graph, an amount of operational time of the electric motor until failure or unsatisfactory operation thereof.

20. The computer program product of claim 19, wherein the processor can further perform the following operations:
receiving data representative of a humidity measurement taken in the general area of the electric motor under test, at or around the time of the insulation winding resistance measurement; and
automatically normalizing the humidity to a predetermined humidity, wherein said determining a normalized insulation resistance value of the electric motor windings further uses the normalized humidity.

* * * * *